(12) United States Patent
Cheng et al.

(10) Patent No.: US 11,362,276 B2
(45) Date of Patent: Jun. 14, 2022

(54) HIGH THERMAL STABILITY $SIO_x$ DOPED GESBTE MATERIALS SUITABLE FOR EMBEDDED PCM APPLICATION

(71) Applicant: MACRONIX INTERNATIONAL CO., LTD., Hsinchu (TW)

(72) Inventors: Huai-Yu Cheng, White Plains, NY (US); Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/833,349

(22) Filed: Mar. 27, 2020

(65) Prior Publication Data

US 2021/0305507 A1    Sep. 30, 2021

(51) Int. Cl.
*H01L 45/00* (2006.01)
*H01L 23/12* (2006.01)
(Continued)

(52) U.S. Cl.
CPC ........ *H01L 45/165* (2013.01); *G11C 11/5678* (2013.01); *H01L 23/12* (2013.01);
(Continued)

(58) Field of Classification Search
CPC ... H01L 45/144; H01L 45/145; H01L 45/147; H01L 27/24–249; G11C 11/5678;
(Continued)

(56) References Cited

U.S. PATENT DOCUMENTS 3,271,591 A    9/1966   Ovshinsky
3,343,034 A    9/1967   Ovshinsky
(Continued)

FOREIGN PATENT DOCUMENTS

CN      1568494 A       1/2005
CN      107210302       9/2017
(Continued)

OTHER PUBLICATIONS

Chen, et al., "Endurance Improvement of Ge2Sb2Te5-Based Phase Change Memory," IEEE Int'l MemoryWorkshop, 2009, May 10-14, 2009, 2 pages.
(Continued)

*Primary Examiner* — Laura M Menz
*Assistant Examiner* — Candice Chan
(74) *Attorney, Agent, or Firm* — Andrew L. Dunlap; Haynes Beffel & Wolfeld LLP

(57) ABSTRACT

A phase-change material having specific $SiO_x$ doping into special Ge-rich $Ge_xSb_yTe_z$ material is described. Integrated circuits using this phase-change material as memory elements in a memory array can pass the solder bonding criteria mentioned above, while exhibiting good set speeds and demonstrating good 10 year data retention characteristics. A memory cell described herein comprises a first electrode and a second electrode; and a memory element in electrical series between the first and second electrode. The memory element comprises a $Ge_xSb_yTe_z$ phase change material with a silicon oxide additive, including a combination of elements having Ge in a range of 28 to 36 at %, Sb in a range of 10 to 20 at %, Te in a range of 25 to 40 at %, Si in a range of 5 to 10 at %, and O in a range of 12 to 23 at %.

21 Claims, 12 Drawing Sheets

(51) Int. Cl.
*H01L 23/488* (2006.01)
*G11C 11/56* (2006.01)
*H01L 27/24* (2006.01)

(52) U.S. Cl.
CPC ........ *H01L 23/488* (2013.01); *H01L 27/2427* (2013.01); *H01L 27/2463* (2013.01); *H01L 45/144* (2013.01)

(58) Field of Classification Search
CPC ............ G11C 13/0002; G11C 13/0004; G11C 13/0007; G11C 2213/31; G11C 2213/33; G11C 2213/34
See application file for complete search history.

(56) References Cited

U.S. PATENT DOCUMENTS

| | | |
|---|---|---|
| 3,530,441 A | 9/1970 | Ovshinsky |
| 3,571,669 A | 3/1971 | Fleming |
| 3,571,670 A | 3/1971 | Ovshinsky |
| 3,571,671 A | 3/1971 | Ovshinsky |
| 3,571,672 A | 3/1971 | Ovshinsky |
| 3,588,638 A | 6/1971 | Fleming et al. |
| 3,611,063 A | 10/1971 | Neale |
| 3,619,732 A | 11/1971 | Neale |
| 3,656,032 A | 4/1972 | Henisch |
| 3,846,767 A | 11/1974 | Cohen |
| 3,875,566 A | 4/1975 | Helbers |
| 3,886,577 A | 5/1975 | Buckley |
| 3,980,505 A | 9/1976 | Buckley |
| 5,159,661 A | 10/1992 | Ovshinsky et al. |
| 5,177,567 A | 1/1993 | Klersy et al. |
| 5,687,112 A | 11/1997 | Ovshinsky |
| 6,579,760 B1 | 6/2003 | Lung |
| 6,800,504 B2 | 10/2004 | Li et al. |
| 6,967,344 B2 | 11/2005 | Ovshinsky et al. |
| 6,995,390 B2 | 2/2006 | Tsukui |
| 7,483,293 B2 | 1/2009 | Pinnow et al. |
| 7,688,619 B2 | 3/2010 | Lung et al. |
| 7,893,419 B2 | 2/2011 | Hudgens et al. |
| 7,902,538 B2 | 3/2011 | Lung |
| 7,903,457 B2 | 3/2011 | Lung |
| 7,929,340 B2 | 4/2011 | Lung et al. |
| 8,138,028 B2 | 3/2012 | Lung et al. |
| 8,148,707 B2 | 4/2012 | Ovshinsky |
| 8,178,387 B2 | 5/2012 | Cheng et al. |
| 8,259,485 B2 | 9/2012 | Yang et al. |
| 8,315,088 B2 | 11/2012 | Lung |
| 8,324,605 B2 | 12/2012 | Lung et al. |
| 8,330,137 B2 | 12/2012 | Schrott et al. |
| 8,344,348 B2 | 1/2013 | Wicker |
| 8,363,463 B2 | 1/2013 | Shih et al. |
| 8,374,019 B2 | 2/2013 | Wu et al. |
| 8,395,927 B2 | 3/2013 | Kreupl et al. |
| 8,410,468 B2 | 4/2013 | Zheng |
| 8,426,242 B2 | 4/2013 | Cheng et al. |
| 8,467,236 B2 | 6/2013 | Campbell |
| 8,634,235 B2 | 1/2014 | Lung et al. |
| 8,646,666 B2 | 2/2014 | May |
| 8,772,747 B2 | 7/2014 | Cheng et al. |
| 8,916,414 B2 | 12/2014 | Cheng et al. |
| 8,932,901 B2 | 1/2015 | Cheng |
| 8,946,666 B2 | 2/2015 | Cheng et al. |
| 9,177,640 B2 | 11/2015 | Shintani et al. |
| 9,190,609 B2 | 11/2015 | Zheng |
| 9,214,229 B2 | 12/2015 | Cheng et al. |
| 9,336,879 B2 | 5/2016 | Lung et al. |
| 9,337,421 B2 | 5/2016 | Chin et al. |
| 9,659,998 B1 | 5/2017 | Lung |
| 9,917,252 B2 | 3/2018 | Cheng et al. |
| 10,050,196 B1 | 8/2018 | Cheng et al. |
| 10,157,671 B1 | 12/2018 | Lung et al. |
| 10,256,406 B2 | 4/2019 | Collins et al. |
| 10,374,009 B1 | 8/2019 | Cheng et al. |
| 10,541,271 B2 | 1/2020 | Cheng et al. |
| 10,593,875 B2 | 3/2020 | Lai et al. |
| 10,978,511 B1 | 4/2021 | Cheng et al. |
| 11,158,787 B2 | 10/2021 | Cheng et al. |
| 2005/0018098 A1 | 1/2005 | Sugihara et al. |
| 2007/0171705 A1 | 7/2007 | Parkinson |
| 2008/0142777 A1 | 6/2008 | Park et al. |
| 2008/0253166 A1 | 10/2008 | Raberg et al. |
| 2008/0272807 A1 | 11/2008 | Lowrey |
| 2009/0014705 A1 | 1/2009 | Hsu et al. |
| 2009/0194759 A1 | 8/2009 | Chin et al. |
| 2009/0230375 A1 | 9/2009 | Liang et al. |
| 2010/0051895 A1 | 3/2010 | Hampton |
| 2010/0054029 A1 | 3/2010 | Happ et al. |
| 2010/0328996 A1 | 12/2010 | Shih et al. |
| 2011/0049456 A1 | 3/2011 | Lung et al. |
| 2011/0084240 A1 | 4/2011 | Schell et al. |
| 2011/0095257 A1 | 4/2011 | Xu et al. |
| 2011/0097825 A1 | 4/2011 | Cheng et al. |
| 2011/0180775 A1 | 7/2011 | Lin et al. |
| 2011/0207284 A1 | 8/2011 | Tominaga et al. |
| 2011/0317480 A1 | 12/2011 | Lung et al. |
| 2012/0025164 A1 | 2/2012 | Deweerd |
| 2012/0062267 A1 | 3/2012 | Saito |
| 2012/0181499 A1 | 7/2012 | Chuang et al. |
| 2012/0193595 A1 | 8/2012 | Cheng et al. |
| 2012/0326111 A1 | 12/2012 | Cheng et al. |
| 2013/0043375 A1 | 2/2013 | Baleine et al. |
| 2013/0105759 A1 | 5/2013 | Cheng |
| 2013/0234093 A1 | 9/2013 | Cheng et al. |
| 2013/0270505 A1 | 10/2013 | Dahmani |
| 2013/0277638 A1 | 10/2013 | Moradpour et al. |
| 2014/0101371 A1 | 4/2014 | Nguyen et al. |
| 2014/0264240 A1 | 9/2014 | Cheng et al. |
| 2014/0376307 A1 | 12/2014 | Shintani |
| 2014/0376309 A1 | 12/2014 | Cheng et al. |
| 2015/0048291 A1 | 2/2015 | Cheng et al. |
| 2016/0276022 A1 | 9/2016 | Redaelli |
| 2016/0336378 A1 | 11/2016 | Ohba et al. |
| 2016/0372188 A1* | 12/2016 | Lung .................. H01L 45/1233 |
| 2016/0372661 A1 | 12/2016 | Cheng et al. |
| 2017/0076797 A1 | 3/2017 | Lung et al. |
| 2017/0244026 A1 | 8/2017 | Wu et al. |
| 2017/0250222 A1 | 8/2017 | Wu et al. |
| 2017/0263863 A1 | 9/2017 | Lung et al. |
| 2017/0271581 A1 | 9/2017 | Seong et al. |
| 2018/0012938 A1 | 1/2018 | Lung et al. |
| 2018/0019391 A1 | 1/2018 | Ohba et al. |
| 2018/0040669 A1 | 2/2018 | Wu |
| 2018/0277601 A1 | 9/2018 | Ahn et al. |
| 2019/0043924 A1 | 2/2019 | Conti et al. |
| 2019/0081103 A1 | 3/2019 | Fantini et al. |
| 2019/0115393 A1 | 4/2019 | Cheng et al. |
| 2019/0148456 A1 | 5/2019 | Wu et al. |
| 2019/0252609 A1 | 8/2019 | Sei et al. |
| 2019/0355790 A1 | 11/2019 | Lung et al. |
| 2019/0355903 A1 | 11/2019 | Lung et al. |
| 2019/0386213 A1 | 12/2019 | Lai et al. |
| 2019/0393268 A1 | 12/2019 | Lai et al. |
| 2020/0052036 A1 | 2/2020 | Ikarashi et al. |
| 2020/0227475 A1 | 7/2020 | Park et al. |
| 2020/0295083 A1 | 9/2020 | Cheng et al. |
| 2021/0111224 A1 | 4/2021 | Cheng et al. |
| 2021/0143216 A1 | 5/2021 | Lai et al. |
| 2021/0184112 A1 | 6/2021 | Cheng et al. |
| 2021/0210554 A1 | 7/2021 | Cheng et al. |

FOREIGN PATENT DOCUMENTS

| | | |
|---|---|---|
| TW | 201633507 A | 9/2016 |
| TW | 201700407 A | 1/2017 |
| TW | 201733177 A | 9/2017 |
| TW | 201801300 A | 1/2018 |
| TW | 201907543 A | 2/2019 |
| TW | 202006931 A | 2/2020 |
| TW | 202036850 A | 10/2020 |

(56) References Cited

OTHER PUBLICATIONS

Cheng et al., "A thermally robust phase change memory by engineering the Ge/N concentration in (Ge, N)xSbyTe z phase change materiaL" 2012 Int'l IEEE IEDM, Dec. 10-13, 2012, 4 pages.
Cheng et al., "The Crystallization Behavior of Ga—Sb Materials as a Function of Composition for Phase Change Random Access Memory," Phase Change and Ovonics Symposium, Sep. 2011, 7 pages.
Cheng et al., Ga46Sb54 Material for Fast Switching and Pb-Free Soldering Reflow Process Complying Phase-Change Memory, ECS J. Solid State Sci. Technol. 2014 vol. 3, issue 7, Jun. 2014, p. 263-p. 267.
Cheng, et al., "A high performance phase change memory with fast switching speed and high temperature retention by engineering the GexSbyTez phase change material," 2011 IEEE Int'l IEDM, Dec. 5-7, 2011, 4 pages.
Cheng, H.Y., et al., "Atomic-level engineering of phase change material for novel fast-switching and high-endurance PCM for storage class memory application," IEEE Int'l Electron Devices Meeting (IEDM), Dec. 9-11, 2013, pp. 30.6.1,30.6.4.
Ciocchini, N., et al. "Unified reliability modeling of Ge-rich phase change memory for embedded applications" IEEE Int'l Electron Devices Meeting (IEDM), Dec. 9-11, 2013, pp. 22.1.1,22.1.4.
Kim, I.S., et al., "High performance PRAM cell scalable to sub-20nm technology with below 4F2 cell size, extendable to DRAM applications," 2010 Symp. on VLSI Technology, Jun. 15-17, 2010, 2 pages.
Lu et al., Ga14Sb86 film for ultralong data retention phase-change memory, J. Appl. Phys. 109, 064503, Jun. 2011, 4 pages.
Morales-Sanchez et al., "Structural, electric and kinetic parameters of ternary alloys of GeSbTe," Thin Solid Films, vol. 471, Issues 1-2, Jan. 3, 2005, pp. 243-247.
Navarro, G., et al., "Trade-off between SET and data retention performance thanks to innovative materials for phase-change memory," IEEE Int'l Electron Devices Meeting (IEDM), Dec. 9-11, 2013, pp. 21.5.1,21.5.4.
Putero et al., Unusual crystallization behavior in Ga—Sb phase change alloys, APL Mat. 1, Jun. 21, 2001, Dec. 2013, 7 pages.
Raoux, et al. "Phase change materials and phase change memory," MRS Bulletin, 39(8), 703-710.
Shah et al., "GaSb—Ge pseudobinary phase diagram," Journal of Electronic Materials, vol. 11, Issue 1, Jan. 1982, 53-58.
Wimmer, et al., Role of activation energy in resistance drift of amorphous phase change materials, Frontiers in Physics, Dec. 2014, vol. 2, Article 75, pp. 1-12.
Wu et al., "A 40nm Low-Power Logic Compatible Phase Change Memory Technology," IEEE IEDM 2018, Dec. 1-5, 2018, 4 pages.

Zuliani, P., et al., "Overcoming Temperature Limitations in Phase Change Memories With Optimized GexSbyTez," IEEE Trans. on Electron Devices, 60(12), Dec. 2013, pp. 4020,4026.
Cheng et al., "An ultra high endurance and thermally stable selector based on TeAsGeSiSe chalcogenides compatible with BEOL IC Integration for cross-point PCM," IEEE IEDM Dec. 2-6, 2017, 4 pages.
Cheng et al., "Si Incorporation into AsSeGe Chalcogenides for High Thermal Stability, High Endurance and Extremely Low Vth Drift 3D Stackable Cross-Point Memory," IEEE Symp. on VLSI Tech., Jun. 16-19, 2020, 2 pages.
Cheng et al., "Ultra-High Endurance and Low IOFF Selector based on AsSeGe Chalcogenides for Wide Memory Window 3D Stackable Crosspoint Memory," IEEE IEDM Dec. 1-5, 2018, 4 pages.
Guo et al., "A Review of Germanium-Antimony-Telluride Phase Change Materials for Non-Volatile Memories and Optical Modulators," Appl. Sci. Feb. 4, 2019, 26 pages; www.mdpi.com/journal/applsci.
Kao et al., "Antimony alloys for phase-change memory with high thermal stability," Scripta Materialia vol. 63, issue 8, Oct. 2010, 855-858.
Mark-Lapedus, "Embedded Phase-Change Memory Emerges," https://semiengineering.com/author/mark-lapedus, Jan. 24, 2019, 13 pages.
NIST Special Publication 800-38D, Dworkin, "Recommendation for Block Cipher Modes of Operation: Galois/Counter Mode (GCM) and GMAC," Nov. 2007, 39 pages.
Ohyanagi et al., "Special Electrical Characteristics of Superlattice Phase Change Memory," ECS Trans., vol. 58, Issue 5, Oct. 31, 2013, pp. 135-158.
Ovshinsky, "New Transformative Possibilities for Ovonic Devices," E*PCOS2010, European Symposium on Phase Change and Ovonic Science, Milan, Italy Sep. 6-7, 2010, 9 pages.
Schuller, Ivan K., Stevens, Rick, Pino, Robinson, and Pechan, Michael. Neuromorphic Computing—From Materials Research to Systems Architecture Roundtable. "Report of a Roundtable Convened to Consider Neuromorphic Computing Basic Research Needs," Oct. 29-30, 2015, 40 pages.
Shanks, "Ovonic threshold switching characteristics," Journal of Non-Crystalline Solids, vol. 2, Jan. 1970, pp. 504-514.
Shin et al., "The effect of doping Sb on the electronic structure and the device characteristics of Ovonic Threshold Switches based on Ge—Se," Scientific Reports, Nov. 18, 2014, 5 pages.
Simpson et al., "Interfacial phase-change memory," Nature Nanotechnology, vol. 6, Jul. 3, 2011, 502-505.
Velea et al., "Te-based chalcogenide materials for selector applications," Scientific Reports, 7:8103, Aug. 14, 2019, 12 pages.
Wikipedia, "Rutherford backscattering spectrometry," downloaded Aug. 4, 2020, available at https://en.wikipedia.org/wiki/Rutherford_backscattering_spectrometry, 8 pages.
U.S. Office Action in U.S. Appl. No. 17/205,767 dated Dec. 21, 2021, 11 pages.

\* cited by examiner

HIGH THERMAL STABILITY SIO$_x$ DOPED GESBTE MATERIALS SUITABLE FOR EMBEDDED PCM APPLICATION

BACKGROUND

Field

The present disclosure relates to phase change memory technology, including phase change memory suitable for use in integrated circuit memory, and for use as embedded memory.

Description of Related Art

Phase change based memory materials, such as chalcogenide-based materials and similar materials, can be caused to change phase between an amorphous phase and a crystalline phase by application of electrical current at levels suitable for implementation in integrated circuits. The generally amorphous phase is characterized by higher electrical resistivity than the generally crystalline phase, which can be readily sensed to indicate data. These properties have generated interest in using programmable resistive material to form non-volatile memory circuits, which can be read and written with random access.

The change from the amorphous phase to the crystalline phase, referred to as set herein, is generally a lower current operation. Generally, a current pulse for a set operation has a magnitude that is not sufficient to melt the active region of a cell, but heats the active region to a transition temperature at which amorphous phase change material tends to change to a crystalline solid phase. The change from crystalline phase to amorphous phase, referred to as reset herein, is generally a higher current operation, which includes a short high current density pulse to melt or breakdown the crystalline structure. The reset pulse generally has a short duration and quick fall time, so that the phase change material cools quickly, quenching the phase change process and allowing at least a portion of the phase change material to stabilize in an amorphous solid phase. The magnitude of the current needed for reset can be reduced by reducing the size of the phase change material element in the cell and/or the contact area between electrodes and the phase change material, such that higher current densities are achieved with small absolute current values through the phase change material element.

One limitation on applications of phase change memory arises from the fact that phase transitions are caused by heat. Thus, heat in an environment in which the chip is deployed can cause loss of data, and loss of reliability.

Also, this limitation to use in environments that do not expose the chips to heat creates another limitation on applications of the technology. Specifically, the chip may be mounted onto and electrically connected to circuitry in a patterned circuit substrate (such as a package substrate, or a printed circuit board, for example), in a surface mount operation or other mounting process that involves a thermal cycle. For example, the surface mount operation typically includes a solder reflow procedure, requiring that the assembly (including the chip) be heated to bring the solder to a temperature about the melting point (or the eutectic point) of the alloy constituting the solder. Other mounting procedures also involve thermal cycles subjecting the chip to high temperatures. This may result in a change in the resistance of the material in these cells, so that the cell is no longer read as programmed.

Common phase-change materials are based on the Ge—Sb—Te material system inherited from optical disk memory. These materials show fast speed but poor data retention. Also, they cannot pass solder bonding thermal cycling criteria, which is specified as an ability to withstand temperature of 260° C. for thirty seconds.

For this reason, prior art phase change memory chips have not been available that are capable of retaining a data set stored before the mounting process, called pre-coded data. So, board manufacturers are required to store any necessary code on the chip, after assembly of the circuit board or after assembly of a system including the circuit board. This makes phase change memory devices less desirable than other types of non-volatile memory for many uses.

It is desirable to provide a phase change memory chip and an integrated circuit with embedded phase change memory, that can be used in extreme operating environments. It is desirable to provide a phase change memory chip that can be coded prior to mounting on a circuit board, using a process that retains the data during thermal cycles encountered during board or assembly manufacturing.

It is desirable to provide materials usable as phase change memory elements in such devices.

SUMMARY

A class of phase-change material having SiO$_x$ doping in Ge-rich Ge$_x$Sb$_y$Te$_z$ material is described. Integrated circuits using this phase change material as memory elements in a memory array can pass the solder bonding criteria mentioned above, while exhibiting good set speeds, and demonstrating good 10 year data retention characteristics.

A memory cell described herein comprises a first electrode and a second electrode, and a memory element in electrical series between the first and second electrode. The memory element comprises a Ge$_x$Sb$_y$Te$_z$ phase change material with a silicon oxide additive, including a combination of elements having Ge in a range of 28 to 36 at %, Sb in a range of 10 to 20 at %, Te in a range of 25 to 40 at %, Si in a range of 5 to 10 at %, and O in a range of 12 to 23 at %.

Examples of the material of the memory elements are described in which Ge is in a range of 29 to 32 at %, including examples in which the Ge is in a range of 29 to 32 at %, the Sb is in a range of 15 to 16 at %, and the Te is in a range of 27 to 31 at %.

Combinations of the elements in the phase change material have concentrations of Ge, Sb, Te, Si and O in amounts effective to have a crystallization transition temperature in excess of 250° C., and to have a set speed less than 1000 ns.

An integrated circuit including an array of memory cells is described having memory elements as described above, in which combinations of the elements in the phase change material have concentrations of Ge, Sb, Te, Si and O in amounts effective to pass solder bonding criteria during testing (exposure to 260° C. for 30 seconds). Using memory elements as described herein, the memory array can be pre-coded, by writing data to the memory array before the integrated circuit is mounted as a component in a system.

The integrated circuit can be primarily a memory device. Also, the memory array in the integrated circuit can be embedded memory, in which the integrated circuit includes logic operably connected to the memory array to use the memory array by intra-chip connections.

The integrated circuit can be a component of a data processing system, in which the integrated circuit is bonded, such as by solder bonding, to a patterned circuit substrate, such as a printed circuit board or multichip substrate, by which it can be connected to other components of the data processing system.

A method for manufacturing a data processing device, comprising storing data in an array of memory cells on an integrated circuit, the array of memory cells having memory elements comprising a $Ge_xSb_yTe_z$ phase change material with a silicon oxide additive, including a combination of elements having Ge in a range of 28 to 36 at %, Sb in a range of 10 to 20 at %, Te in a range of 25 to 40 at %, Si in a range of 5 to 10 at %, and O in a range of 12 to 23 at %; and after storing the data, solder bonding the integrated circuit to a patterned circuit substrate.

Other aspects and advantages of the present disclosure can be seen on review of the drawings, the detailed description and the claims, which follow.

DETAILED DESCRIPTION

A detailed description of embodiments of the present disclosure is provided with reference to the FIGS. 1-19. A new class of phase change material is described which comprises a silicon oxide doped, Ge-rich GST. The term "doped" as used herein refers to additives combined with the GST in amounts effective to achieve desirable changes in characteristics of GST not including the additive.

Representative materials in the class include materials A-D identified the following table.

|  | [Ge] at. % | [Sb] at. % | [Te] at. % | [Si] at. % | [O] at. % |
|---|---|---|---|---|---|
| Material A | 30.1 ± 0.5 | 15.8 ± 5 | 30.7 ± 5 | 8.4 ± 0.5 | 15.0 ± 2 |
| Material B | 30.7 ± 0.5 | 14.7 ± 5 | 26.5 ± 5 | 7.7 ± 0.5 | 20.4 ± 2 |
| Material C | 31.4 ± 0.5 | 15.1 ± 5 | 27.9 ± 5 | 8.9 ± 0.5 | 16.7 ± 2 |
| Material D | 34.9 ± 0.5 | 14.0 ± 5 | 26.3 ± 5 | 7.6 ± 0.5 | 17.2 ± 2 |

The new class of materials are a $Ge_xSb_yTe_z$ phase change material with a silicon oxide additive, including a combination of elements having Ge in a range of 28 to 36 at %, Sb in a range of 10 to 20 at %, Te in a range of 25 to 40 at %, Si in a range of 5 to 10 at %, and O in a range of 12 to 23 at %.

Examples of the material of the memory elements are described in which Ge is in a range of 29 to 32 at %. Examples are also described in which the Ge is in a range of 29 to 32 at %, the Sb is in a range of 15 to 16 at %, and the Te is in a range of 27 to 31 at %.

Figure 1:
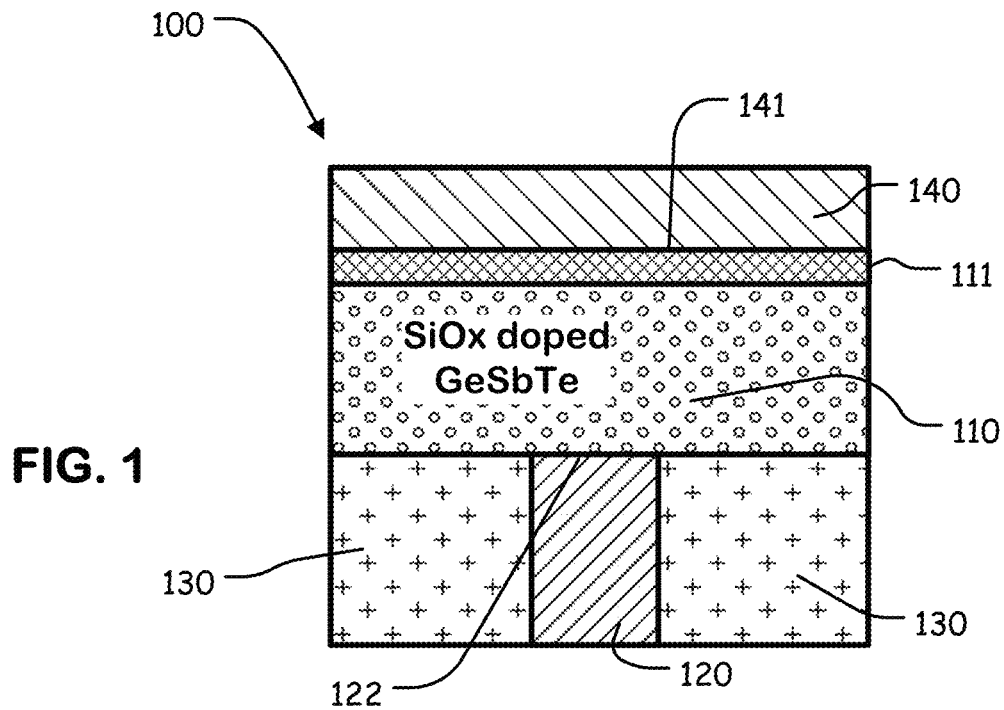
FIG. 1 illustrates structure of a "mushroom" type memory element including a memory element comprising $SiO_x$ doped Ge-rich $Ge_xSb_yTe_z$ material.

FIG. 1 illustrates a "mushroom" type memory element 100 having a first electrode 120 extending through dielectric 130, comprising a memory element 110 of silicon oxide doped, Ge-rich GST phase change material, a buffer 111, in the form of a continuous layer, in this embodiment contacting the memory element 110, and a second electrode 140 on the memory element 110. The first electrode 120 contacts the memory element of phase change material over a first contact area 122, and the second electrode contacts the carbon deposit over a second contact area 141. In a mushroom type memory element, as illustrated, the first contact area 122 is smaller than the second contact area 141, such as at least 50% smaller, and in some embodiments at least 90% smaller. The first electrode 120 is coupled to a terminal of an access device (not shown) such as a diode or switch, while the second electrode 140 is coupled to a bit line and can be part of the bit line (not shown). The small first contact area 122, between the memory element of phase change material and the first electrode 120, and a relatively larger second contact area 141 between the carbon deposit 111 and the second electrode 140, results in higher current densities with small absolute current values in an active region of the memory element 110 proximal to the first electrode 120. In one example configuration, the first electrode 120 has a first contact area 122 on the order of 15 to 30 square nanometers, while the second electrode may have a contact area 141 that is continuous along a conductive line, acting as a bit line or local bit line, with the memory element of phase change material formed so as to line the bottom side of the conductive line continuously along a length that of the conductive line, with first electrodes (like 120) of a plurality of mushroom memory elements contacting the memory element distributed along the length.

The buffer layer 111 can be a sputter deposited formation having a thickness less than 15 nm, such as about 10 nm, contacting the memory element of phase change material.

The buffer layer can comprise carbon, carbon silicide, titanium nitride or other suitable buffer layer materials.

The memory element of phase change material can have a thickness in the region of the first contact area 122 selected according to operating characteristics of the particular materials, and can be on the order of 50 nm, for example. The thickness of the phase change material depends on the design and operating conditions of the cell structure.

The first and second electrodes 120, 140 may comprise, for example, TiN or TaN. Alternatively, the first and second electrodes 120, 140 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof.

In the illustrated embodiment the dielectric 130 comprises silicon nitride. Alternatively, other dielectric materials, such as silicon oxides, may be used.

The contact area 122 between the first electrode 120 and the memory element 110 of phase change material has a width (which in some embodiments is a diameter) less than that of the contact area 141 between the memory element 110 of phase change material and the second electrode 140. Thus, current is concentrated in the portion of the memory element 110 proximal to or adjacent the first electrode 120, resulting in the active region in which the phase change kinetics are confined during operation.

The first electrode 120 extends through dielectric 130 to underlying access circuitry (not shown). The underlying access circuitry can be formed by standard processes as known in the art, and the configuration of elements of the access circuitry depends upon the array configuration in which the memory cells described herein are implemented. Generally, the access circuitry may include access device switches, such as Ovonic threshold switches, FET transistors or bipolar transistors. Also, access devices such as diodes can be utilized. Other elements of access circuitry include word lines and sources lines, conductive plugs, and doped regions used as conductors within a semiconductor substrate.

Figure 2:
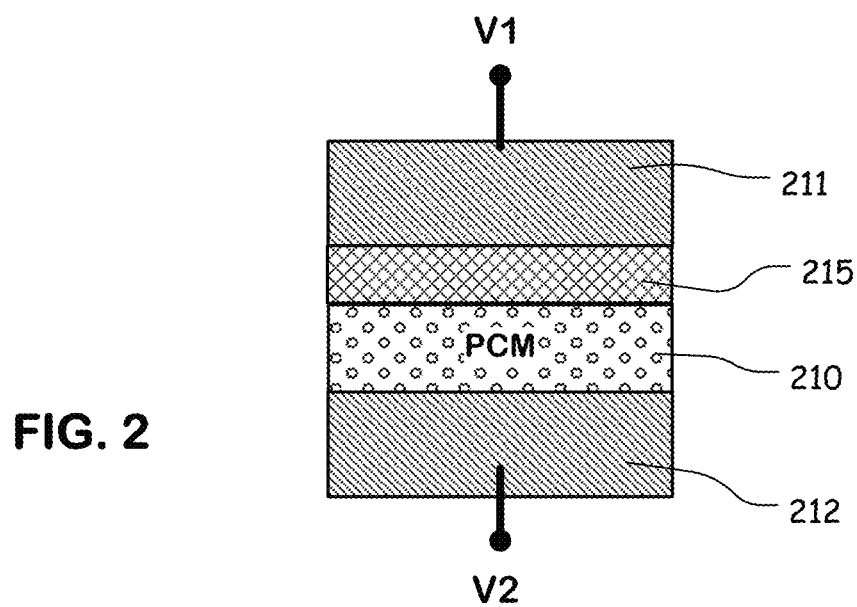
FIG. 2 illustrates an "active in via" type memory element structure including a memory element comprising $SiO_x$ doped Ge-rich $Ge_xSb_yTe_z$ material.

FIG. 2 illustrates a cross-sectional view of a pillar-shaped memory element having an "active in via" structure. The memory element includes a memory element 210 of phase change material between first and second electrodes 212, 211, with a buffer 215 formed between the memory element 210 of silicon oxide doped, Ge-rich GST phase change material and the second electrode 211. The memory element has a width substantially the same, in this example, as that of the first and second electrodes 212, 211 to define a multi-layer pillar surrounded by dielectric (not shown), in operation, as current passes between the first and second electrodes 212, 211 through the carbon deposit 215 and the memory element 210.

Figure 3:
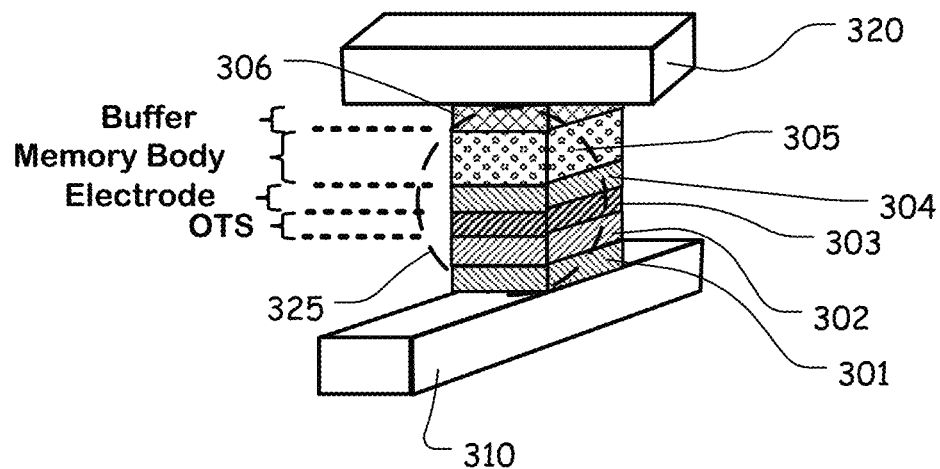
FIG. 3 illustrates structure of a cross-point memory cell with a memory element including a memory element comprising $SiO_x$ doped Ge-rich $Ge_xSb_yTe_z$ material.

FIG. 3 illustrates an example memory cell 325 which comprises a multi-layer pillar disposed in the cross-point of a first access line 310 and a second access line 320.

The pillar in this example includes a bottom electrode layer 301, such as a metal, metal nitride, a doped semiconductor, or the like, on the first access line 310.

A buffer layer 302 is disposed on the bottom electrode layer 301. In some embodiments, the buffer layer 302 can be a composition such as carbon, or a combination of silicon and carbon. The buffer layer 302 can be, for example, 15 to 30 nm thick.

An OTS switching layer 303 is disposed on the buffer layer 302. The OTS switching layer 303 can comprise an OTS material such as, for some examples, AsSeGeSi, AsSeGeSiC, AsSeGeSiN, AsSeGeSiTe, AsSeGeSiTeS, AsTeGeSi, AsTeGeSiN, and other available OTS materials. The OTS switching layer can be for example, 15 to 45 nm thick, and preferably less than 50 nm thick.

A buffer layer 304 is disposed on the OTS switching layer 303, and can be called a capping layer for the OTS material. The buffer layer 304 can be a barrier layer that comprises a composition of silicon and carbon. The buffer layer 304 can be, for example, 15 to 30 nm thick.

A memory element 305 is disposed on the buffer layer 304. The material of the memory element comprises a silicon oxide doped, Ge-rich GST phase change memory material.

The memory element 305 can be a layer having a thickness selected according to the particular embodiment.

A buffer 306 is disposed on a top surface of the memory element 305. The buffer 306 can be, for example, a continuous layer of carbon or other material, 5 to 15 nm thick.

The first access lines (bit lines) and the second access lines (word lines) can comprise a variety of metals, metal-like materials and doped semiconductors, or combinations thereof. Embodiments of the first and second access lines can be implemented using one or more layers of materials like tungsten (W), aluminum (Al), copper (Cu), titanium nitride (TiN), tantalum nitride (TaN), tungsten nitride (WN), doped polysilicon, cobalt silicide (CoSi), Tungsten silicide (WSi), TiN/W/TiN, and other materials. For example, the thicknesses of the first access lines and the second access lines can range from 10 to 100 nm. In other embodiments, the first access lines and the second access lines can be very thin, or much thicker. The material selected for the second access lines is preferably selected for compatibility with the carbon deposit 306 in this example, or otherwise with the memory cell 325. Likewise, the material selected for the first access lines is preferably selected for compatibility with the electrode material of the bottom electrode layer 301, or otherwise with the memory cell 325.

In another embodiment, a bottom electrode layer like that shown in FIG. 1 has a smaller contact surface than the surface of the switching layer. As such, an increased current density can be achieved.

Figure 4:
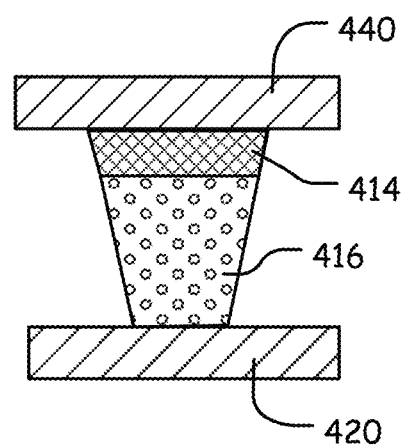
FIG. 4 illustrates structure of a "pore" type memory element including a memory element comprising $SiO_x$ doped Ge-rich $Ge_xSb_yTe_z$ material.

FIG. 4 illustrates a cross-sectional view of a fourth memory element having a pore-type structure. The memory element 416 is a body of silicon oxide doped, Ge-rich GST phase change material surrounded by dielectric (not shown) in electrical series between first and second electrodes 420, 440 at top and bottom surfaces, respectively. A buffer 414 is formed on a top surface of the memory element 416 of phase change material as discussed above. The memory element 416 of phase change material can have a width proximal the top electrode 440 that is greater than the width proximal the first electrode 420.

Figure 5:
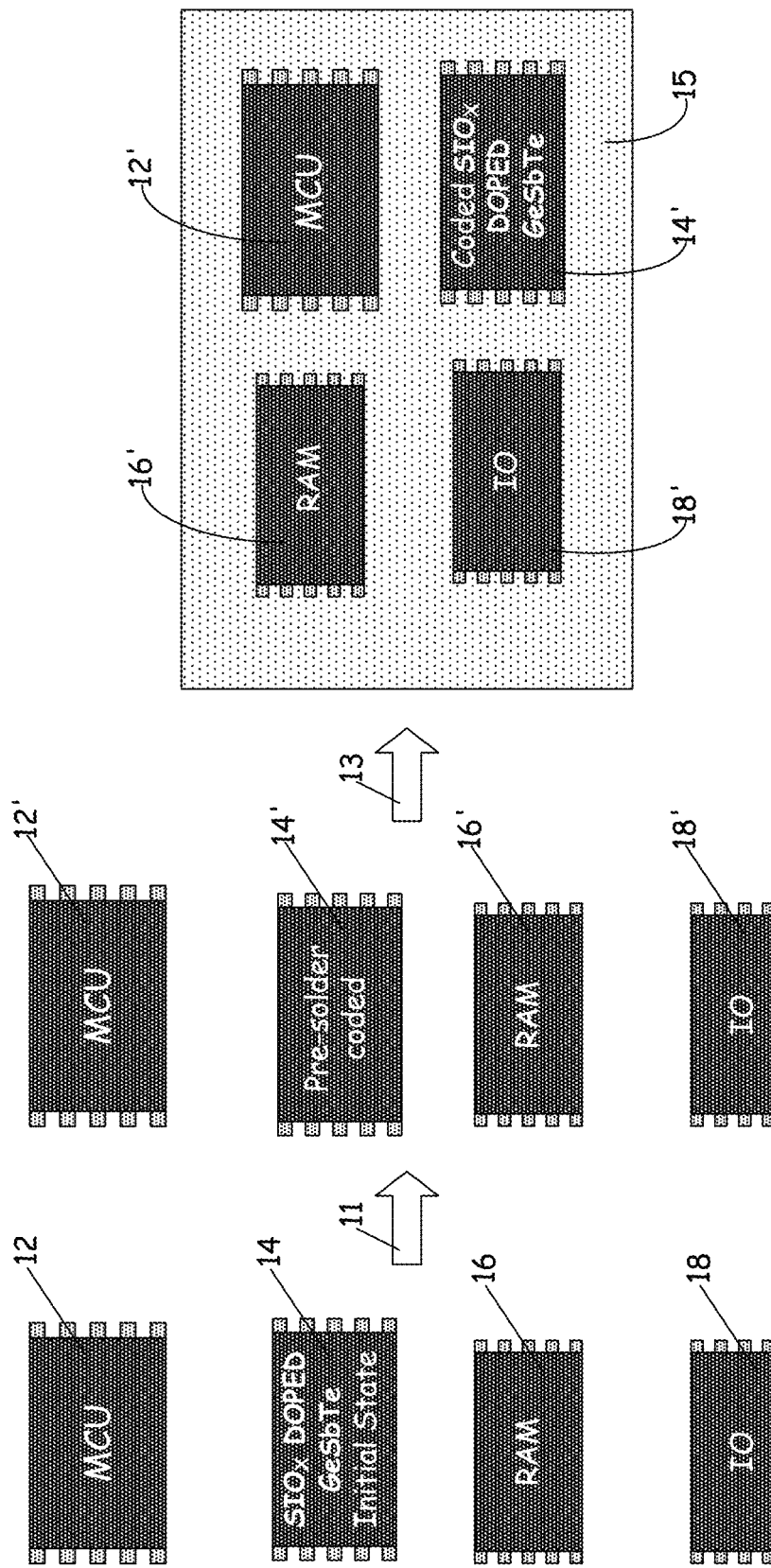
FIG. 5 diagrammatically illustrates stages in an example of constructing an assembly of semiconductor chips including a pre-coded chip on a circuit board or other substrate.

FIG. 5 diagrammatically illustrates stages in an example of constructing an assembly of semiconductor chips on a circuit board or other substrate. In this example, the desired selection of chips, such as a microcontroller unit MCU 12, a silicon oxide doped, Ge-rich GST phase change memory PCM 14, at least part of which can be used for storing code or other data sets, random access memory RAM 16, and an input/output I/O device 18 are "designed in" for an electronic product including a circuit board. The non-volatile memory in one or more of the selected chips can be programmed by a manufacturer as indicated by arrow 11, such as using a program and test system before or after packaging of the individual chips. In this example, the PCM 14 is programmed using a pre-mounting coding process to yield pre-coded PCM 14'. Also, any coding in the other chips can also be carried out at this stage, to yield a collection of pre-coded chips of PCM 14', adapted for a specific use in the field. The pre-coded chips are thereafter mounted as indicated by arrow 13 onto a circuit board (for example, a motherboard) 15 or other substrate. The procedure used to mount the chips on the substrate can require a thermal cycle that heats the chips, during which the memory cells in the coded PCM can be raised to a temperature above a transition temperature for changes in solid phase of typical phase change memory materials. Also, in some embodiments known as system-on-a-chip SOC devices, a single chip, including an embedded memory including silicon oxide doped, Ge-rich GST phase change memory array and other circuitry, can be used in place of the four devices illustrated in FIG. 5.

Figure 6A:
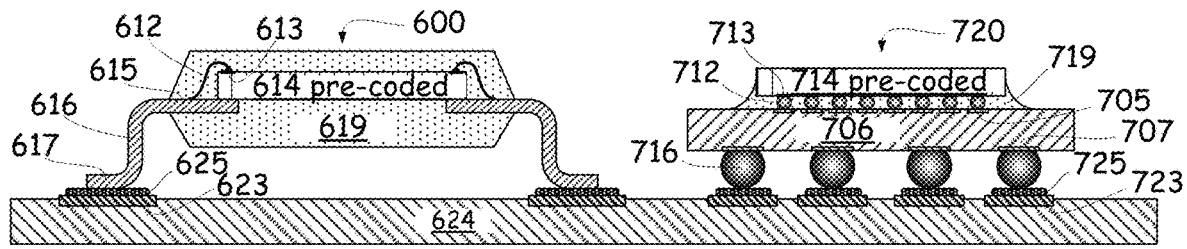
FIGS. 6A and 6B illustrate stages in a surface mount operation suitable for integrated circuits described herein.
Figure 6B:
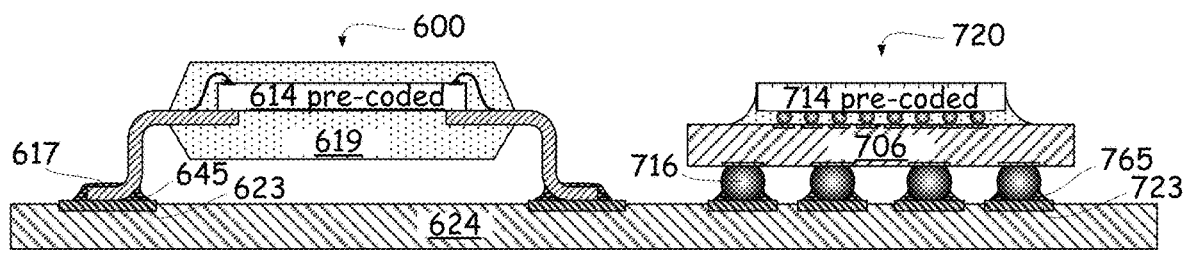

A representative mounting procedure that includes a thermal process that can disturb prior art phase change memory cells is discussed with reference to FIGS. 6A, 6B and 7. Stages in a surface mount operation are illustrated in FIGS. 6A and 6B. In the example shown in these Figures, a leadframe package 600 and a flip-chip package 720 are mounted onto and electrically connected to bond sites 623, 723 exposed at a package mount surface of a circuit board 624.

The leadframe package 600 in this example includes a semiconductor die 614, which can be pre-coded as described herein, mounted active side upward on leads 616. Interconnect pads 613 in the die are electrically connected to bond sites on bond fingers 615 on the leads 616 by wire bonds 612. The die, wire bonds, and bond fingers are enclosed in a protective encapsulation 619, constituting a package body from which the leads project. The leads 616 have a dogleg shape, so that the feet 617 are situated below the package body, and some clearance is provided between the lower surface of the package body and the upper surface of the circuit board when the feet 617 of the leads are at rest on the bond sites 623.

The flip-chip package 720 in this example includes a die 714 which can be pre-coded as described herein, mounted in a flip-chip fashion on, and electrically connected to circuitry on, a package substrate 706. Electrically conductive balls or bumps (typically metal, such as gold or solder) 712 are mounted on interconnect pads 713 on the die. Bond pads 705 connected to circuitry in the substrate 706 are exposed at the die attach surface of the substrate to provide bond sites for attachment of the interconnect balls or bumps. Second-level interconnect lands 707 on the opposite side of the substrate are connected to bond pads 705 by way of the circuitry in the substrate. An underfill 719 fills the space between the active side of the die and the die mount side of the package substrate, to complete the package. Solder balls 716 are mounted on the lands 707 to provide for electrical connection of the package 720 to bond sites 723 on the circuit board.

The second-level interconnection of the leadframe package 600 and the flip-chip package 720 is made by soldering the feet 617 and the second-level interconnect solder balls 716 onto the bond sites 623, 723. Typically, prior to mounting the packages, the circuit board is prepared by depositing small amounts of solder or solder paste (for example by plating or printing) on the bond sites (the solder or solder paste may optionally be omitted for flip-chip interconnection). Then, the packages are oriented so that the feet 617 and the solder balls 716 are aligned with corresponding bond sites 623, 723 on the circuit board, and the packages are moved toward the circuit board so that the feet 617 and solder balls 716 rest on the solder or solder paste 625, 725.

Thereafter, the solder or paste (or second-level interconnect solder balls) is heated to reflow the solder and complete the electrical connection. Typically, where solder or solder paste is provided, feet or balls are wetted by the reflowed solder, so that the solder flows over the surfaces of the bond sites 623, 723 and onto the lower surfaces of the feet and the balls, as indicated at 645 and 765 in FIG. 6B.

Heating to reflow the solder or solder paste, typically by passing the assembly through a reflow oven, requires raising the temperature of the assembly according to a time/temperature schedule suitable for the particular solder.

Figure 7:
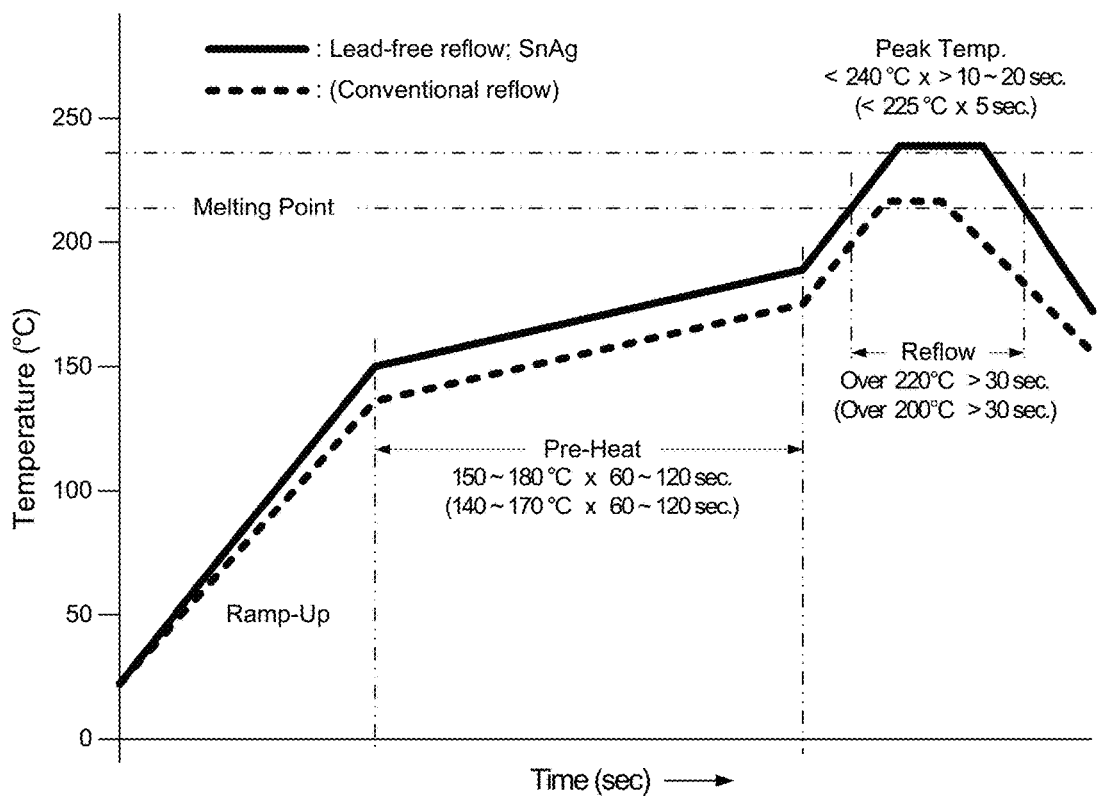
FIG. 7 shows examples of reflow heating schedules for a conventional solder (broken line) and for a lead-free SnAg solder.

FIG. 7 shows examples of reflow heating schedules for a conventional solder (broken line) and for a lead-free SnAg solder. The lead-free solder has a higher melting point and reflows more slowly and, accordingly, the assembly must be brought to a higher temperature and held there for a longer time for the lead-free solder than for the conventional solder. Particularly, for a typical lead-free solder, the temperature is raised during a pre-heat phase from about 150° C. to about 180° C. over a period of about 60 to 120 seconds; and then during a reflow phase lasting over 30 seconds the temperature is raised more rapidly to a peak temperature approaching about 240° C., and is held there for a period of about 10 to 20 seconds or longer and then is allowed to fall; the temperature throughout the reflow phase exceeds about 220° C. And particularly, for a conventional solder, the temperature is raised during a pre-heat phase from about 140° C. to about 170° C. over a period of about 60 to 120 seconds; and then during a reflow phase lasting over 30 seconds the temperature is raised more rapidly to a peak temperature in approaching about 225° C., and is held there for a period of about 5 seconds or longer; the temperature throughout the reflow phase exceeds about 200° C. An industry specification for solder bonding qualification calls for an ability to withstand 260° C. for thirty seconds or more.

Figure 8:
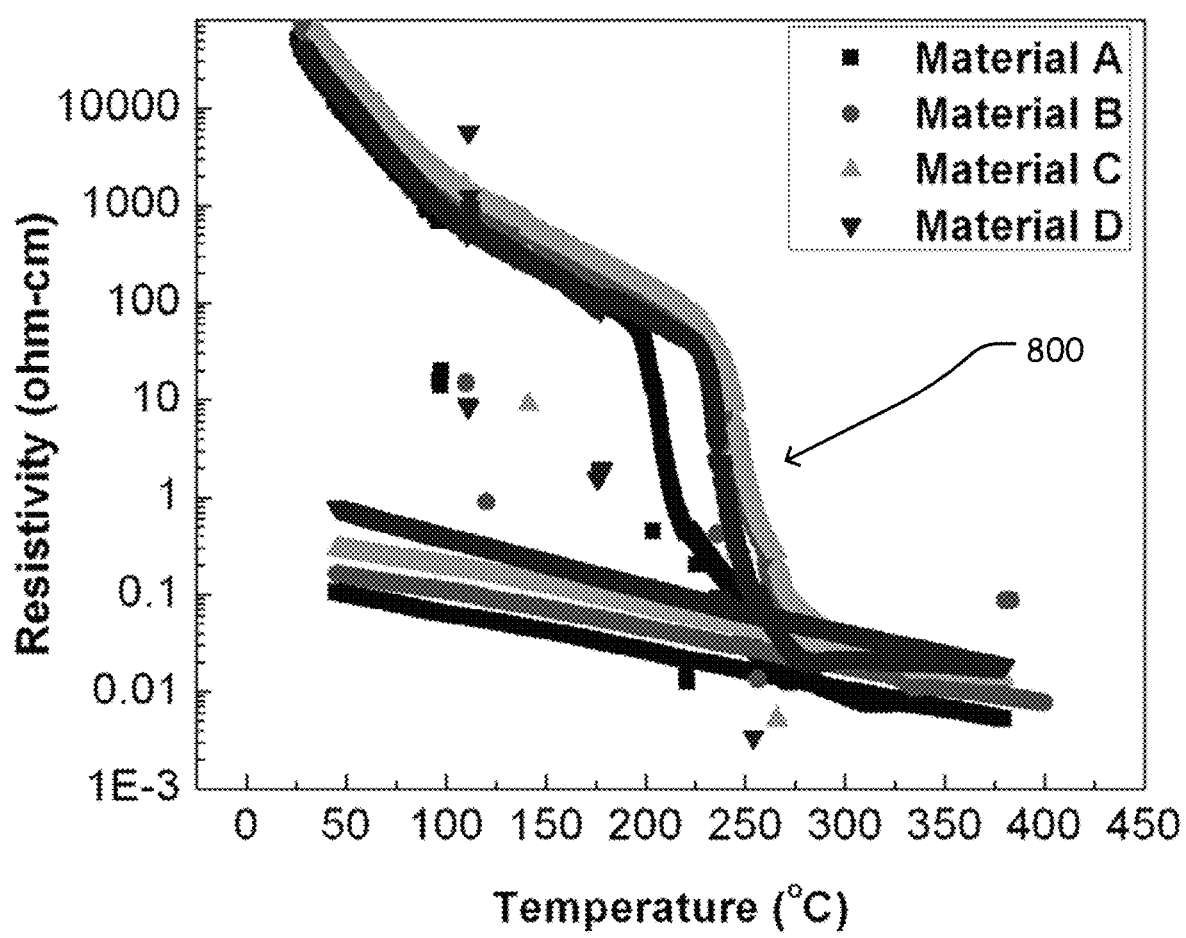
FIG. 8 is a graph of temperature versus resistivity, illustrating the crystallization transition temperature for Materials A-D.

FIG. 8 is a graph of the results of thermal cycling that establish a crystallization transition temperature (generally 800) where the resistance begins to fall on the heat up cycle, on the order of 250° or higher, including at least 260° for materials A-D. Also, the graph illustrates that the resistance in the crystalline phase increases slightly with an increase in germanium Ge concentration.

The following a chart shows characteristics of materials A and C.

|  | R Window | SET Current | SET Speed | Endurance | Soldering 260 C/ 90 s | 10 Years |
|---|---|---|---|---|---|---|
| Material A | 100K/ 500K (5X) | 300 uA | ~2 us | 10K | Pass | 145 C |
| Material C | 100K/ 500K (5X) | 300 uA | 800 ns | 100K | Pass | 140 C |

As seen, each of the materials A and C shows a resistance window for the set and reset states of about 100K ohms and 500K ohms, respectively, so that the resistance of the reset state is five times that of the set state. For testing involving a set current of 300 μA, the set speed for Material A is about 2 μs. For Material C the set speed is about 800 ns. The endurance according to testing for Material A is about 10K cycles, whereas for material C the endurance is about 100K cycles. Both materials pass three times the solder bonding criteria extended from the standard 260° at 30 seconds up to 260° at 90 seconds. Also, Material A demonstrates 10 years endurance at 145° C. Material C demonstrates 10 years endurance at 140° C.

Figure 9:
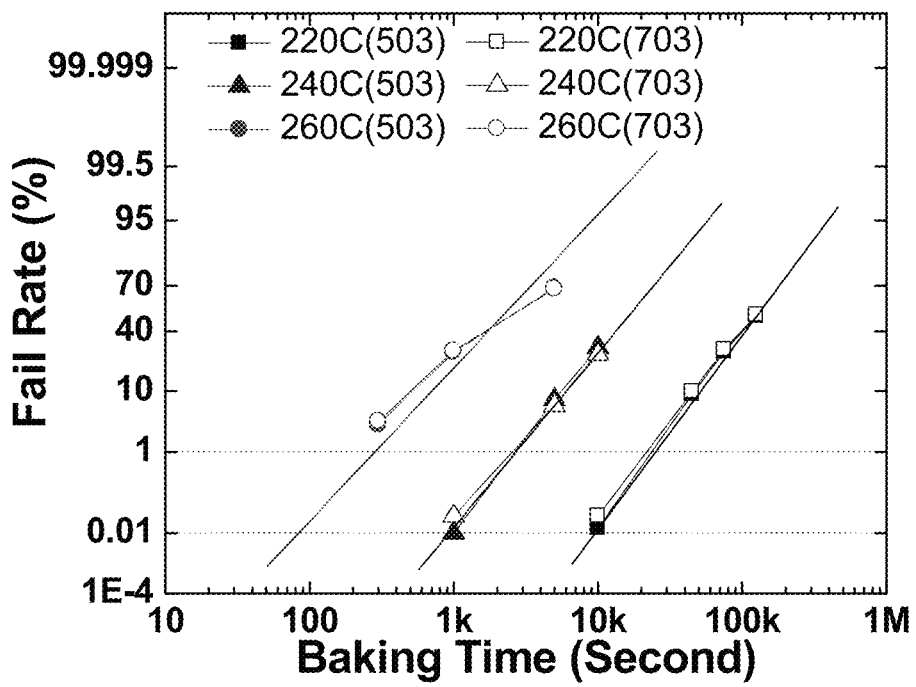
FIG. 9 is a graph of baking time at various temperatures versus failure rate for Material A.
Figure 10:
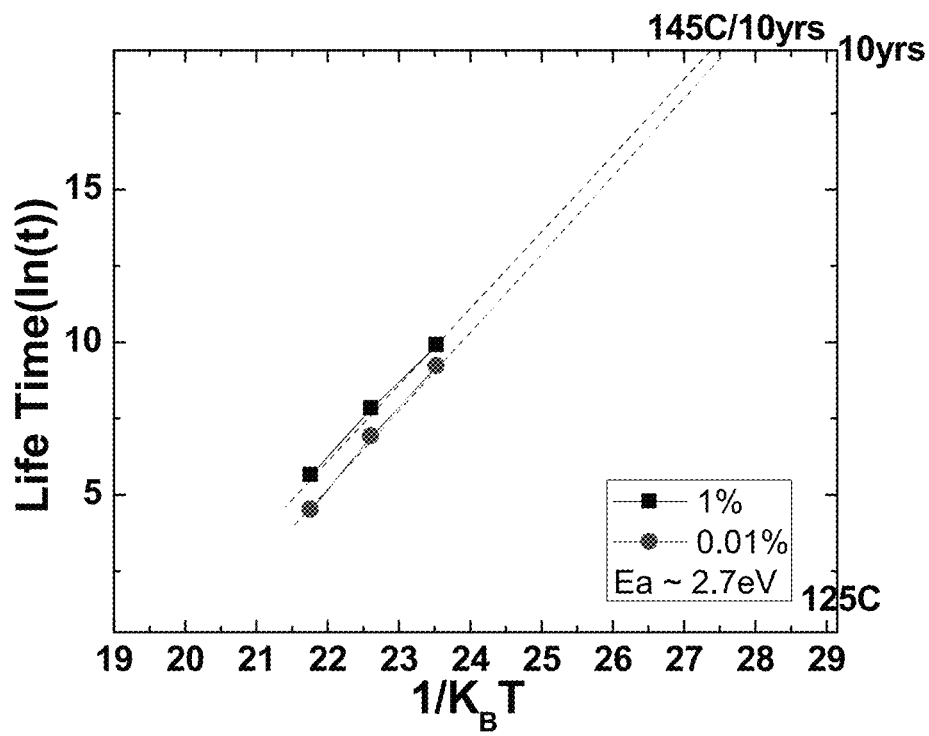
FIG. 10 is a graph illustrating results of endurance testing of Material A.

FIG. 9 is a graph showing test results for two samples of Material A, a failure rate versus baking time. FIG. 10 is a graph showing lifetime versus temperature (1/KBT) for the two samples. This testing demonstrates an activation energy Ea (as in Arrhenius equation) of about 2.7 electron volts for Material A, passing the endurance criterion of 145° C. for 10 years.

Figure 11:
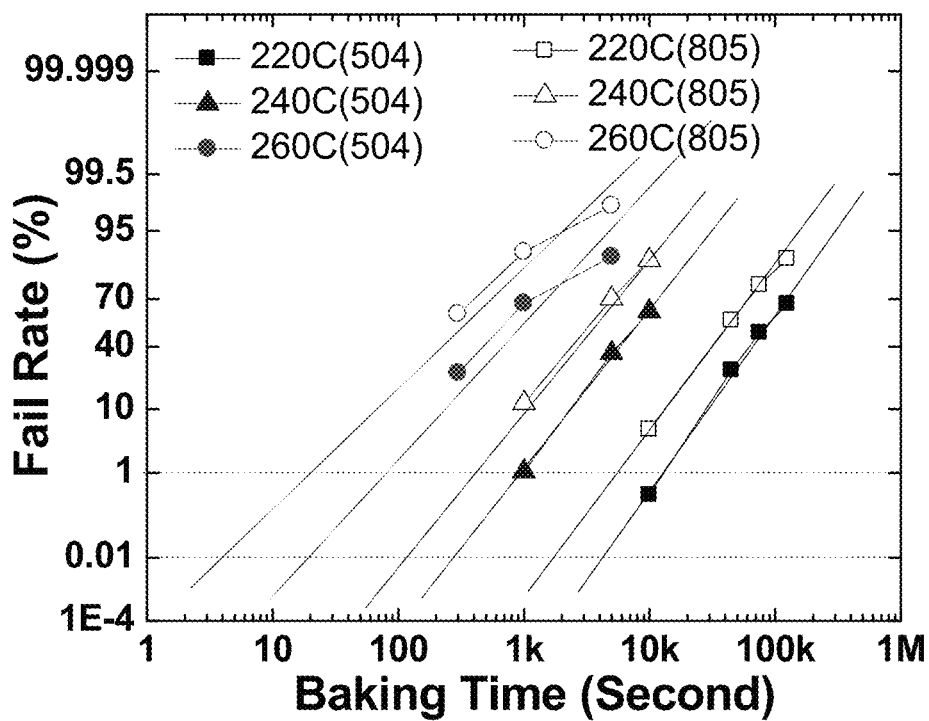
FIG. 11 is a graph of baking time at various temperatures versus failure rate for Material C.
Figure 12:
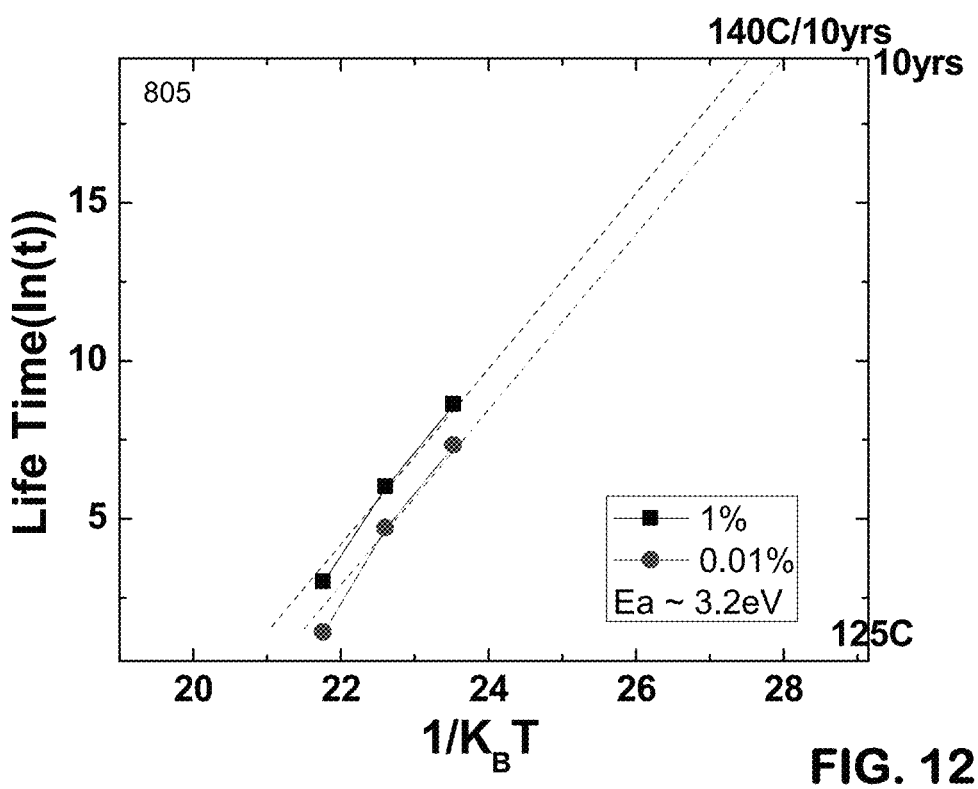
FIG. 12 is a graph illustrating results of endurance testing of Material C.

FIG. 11 is a graph showing test results for two samples of Material C, a failure rate versus baking time. FIG. 12 is a graph showing lifetime versus temperature (1/KBT) for the two samples. This testing demonstrates an activation energy Ea of about 3.2 electron volts for Material A, passing the endurance criterion of 140° C. for 10 years. Material C however has a faster set speed at 800 ns, and can pass the solder bonding criteria.

Figure 13:
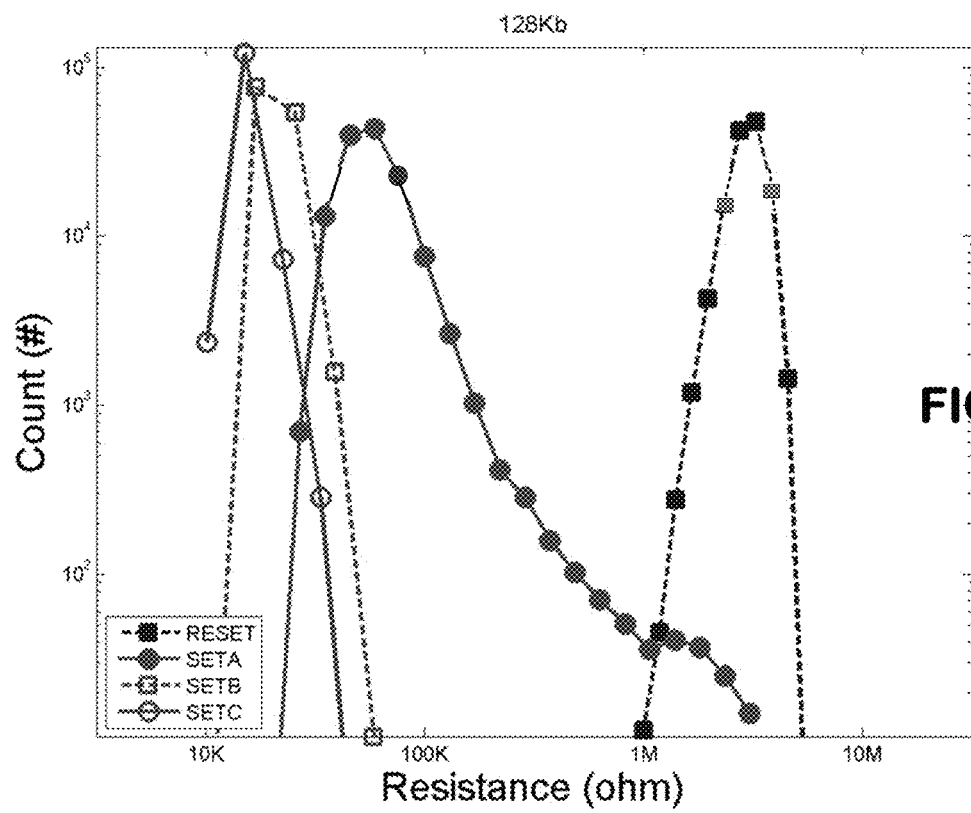
FIGS. 13 and 14 are graphs of resistance distribution in a memory array on an integrated circuit before and after baking according to solder bonding criterion testing for Material A.

FIG. 13 illustrates the resistance distribution for a memory array comprising memory elements of Material A, in a memory at array having set and reset cells, and using three different set pulse magnitudes. The results plotted were based on tests after 10 set/reset cycles on the memory cells. The three different set pulse characteristics include 150 µA for 960 ns, 200 µA for 960 ns and 300 µA for 960 ns. The longer set pulses resulted in a tighter and lower resistance distribution. The reset pulse in this example was 400 µA for 40 ns. In the test, equal numbers of cells were exposed to each of the four conditions, including three set conditions and one reset condition.

Figure 14:
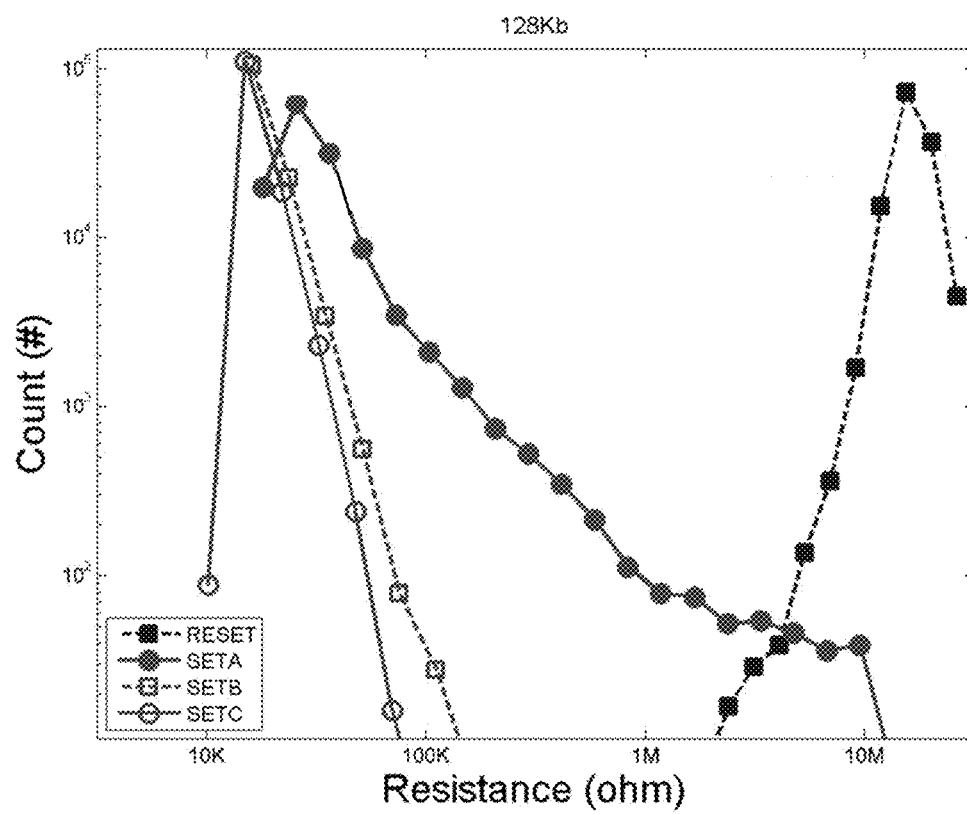

FIG. 14 illustrates the distribution measured after exposing the integrated circuit to a ramp to 260° C. for 90 seconds to verify the solder bonding criterion. As seen, the integrated circuit passes the criterion in which the resistance in the reset condition remains above 500 K ohms and in the set condition remains below 100 K ohms for the set pulse amplitudes of 200 and 300 µA.

Figure 15:
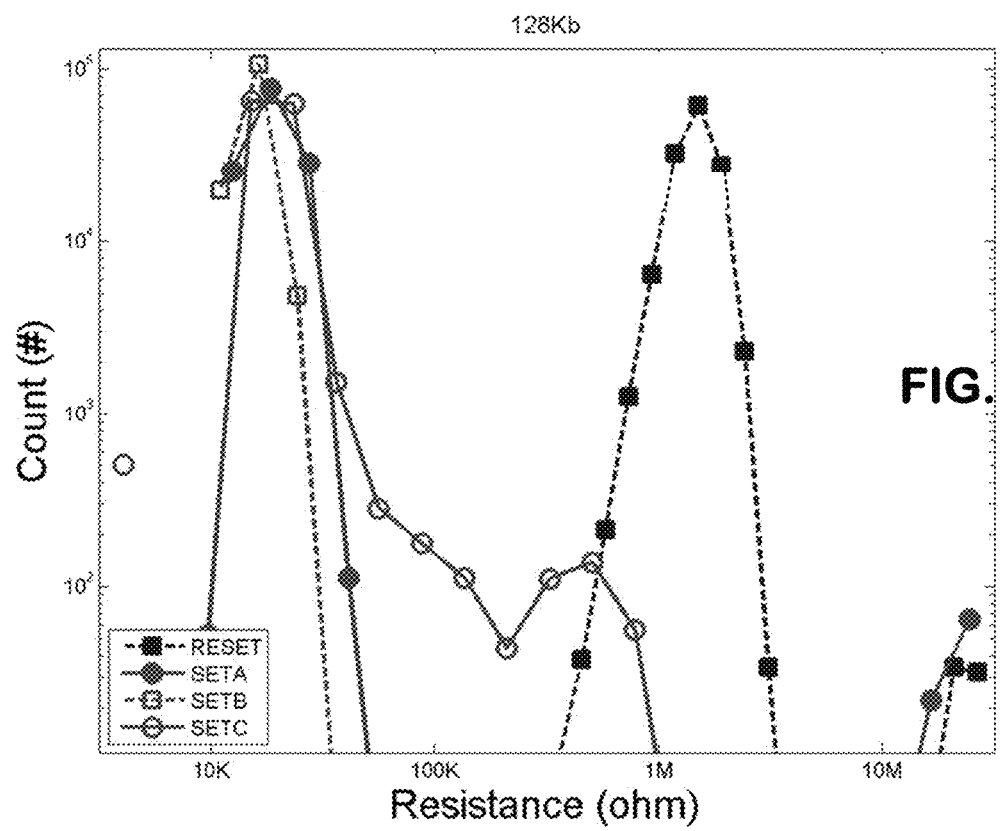
FIGS. 15 and 16 are graphs of resistance distribution in a memory array on an integrated circuit before and after baking according to solder bonding criterion testing for Material C.

FIG. 15 illustrates the resistance distribution for a memory array comprising memory elements of Material C, in a memory at array having set and reset cells, and using three different set pulse magnitudes. The results plotted were based on tests after 10 set/reset cycles on the memory cells. The three different set pulse characteristics include 300 µA for 800 ns, 300 µA for 960 ns and 200 µA for 960 ns. The longer set pulses at higher magnitude resulted in a tighter and lower resistance distribution. The reset pulse in this example was 400 µA for 40 ns. In the test, equal numbers of cells were exposed to each of the four conditions, including three set conditions and one reset condition.

Figure 16:
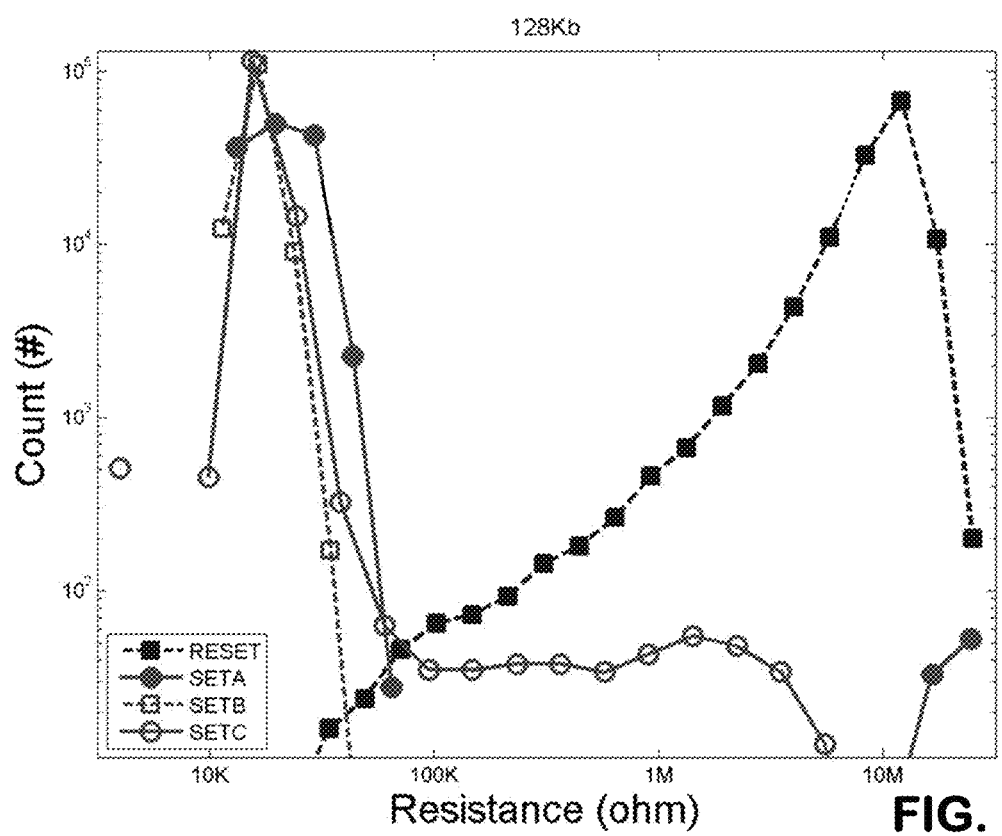

FIG. 16 illustrates the distribution measured after exposing the integrated circuit to a ramp up to 260° C. for 90 seconds, to verify solder bonding criterion. As seen, both of the 300 µs set pulses can pass the solder bonding criterion, with less than 0.5% yield loss for the 90 second exposure, where the passing criterion requires the resistance in the reset condition remains above 500 K ohms and in the set condition remains below 100 K ohms.

Other testing of materials A-D shows that at least materials A and C in this new class of materials, can be set with pulse lengths substantially less than 1000 ns.

Testing of the examples of materials in the new class of $SiO_x$ doped, Ge-rich $Ge_xSb_yTe_z$ material used for phase change memory demonstrates that the Ge, Sb, Te, Si and O elements can be used in combinations effective to have a set speed less than 1000 ns, and as low as 640 ns. Also, this testing demonstrates that within this new class of phase change materials, the Ge, Sb, Te, Si and O elements can be used in combinations effective to have crystallization transition temperatures greater than 250° C. Also, this testing demonstrates that for memory arrays on integrated circuits using this new class of phase change materials, the Ge, Sb, Te, Si and O elements can be used in combinations effective to pass solder bonding criterion.

Figure 17:
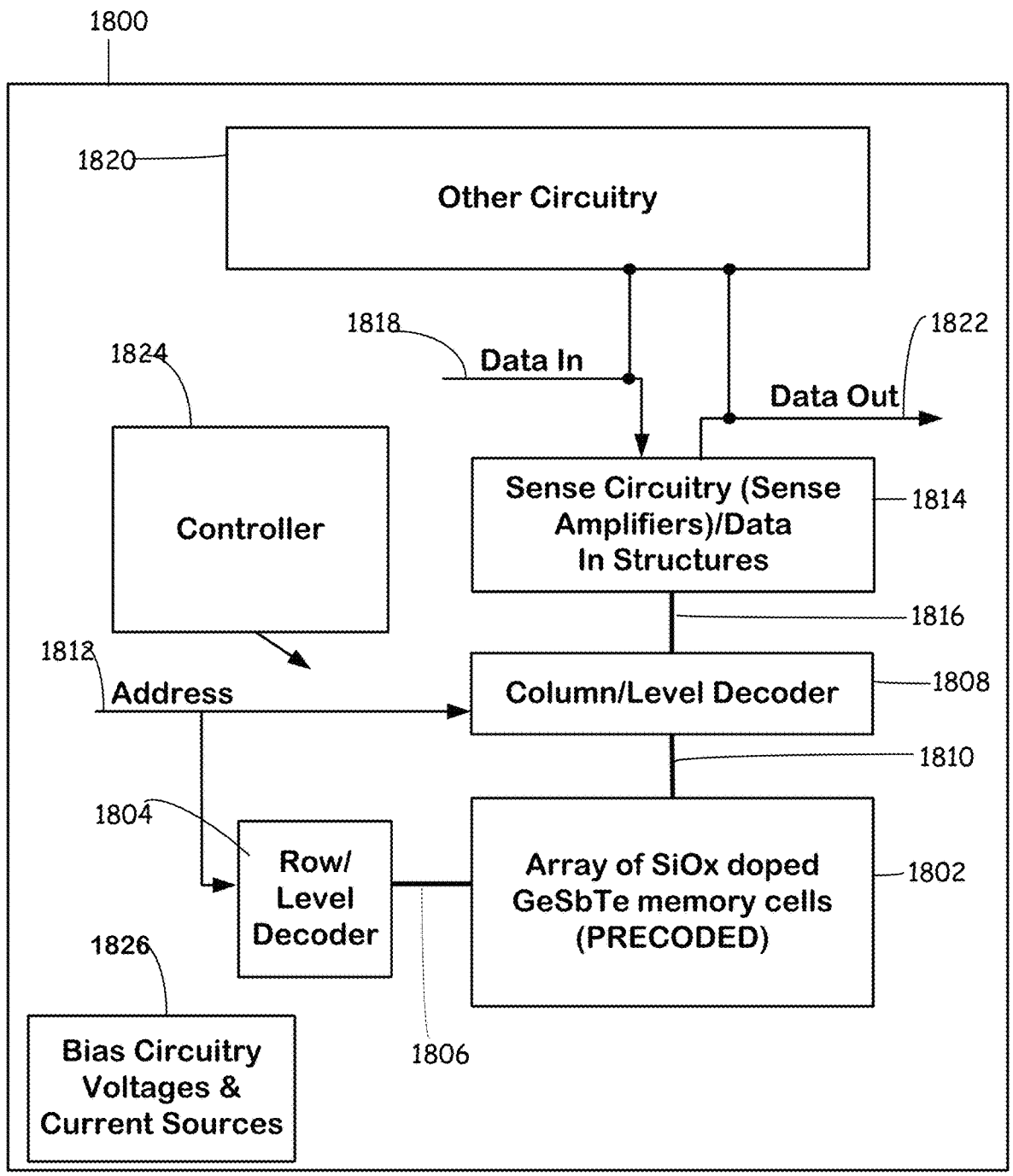
FIG. 17 is a simplified block diagram of an integrated circuit memory device including phase change memory cells as described herein.

FIG. 17 is a simplified block diagram of an integrated circuit 1800 including an embedded phase change memory array 1802 of memory cells having memory elements formed by $SiO_x$ doped, Ge-rich $Ge_xSb_yTe_z$ materials as described herein. A row/level line decoder 1804 having read, set and reset modes is coupled to, and in electrical communication with, a plurality of word lines 1806 arranged in levels and along rows in the array 1802. A column/level decoder 1808 is in electrical communication with a plurality of bit lines 1810 arranged in levels and along columns in the array 1802 for reading, setting, and resetting the memory cells in the array 1802. Addresses are supplied on bus 1812 to row/level decoder 1804 and column/level decoder 1808. Sense circuitry (Sense amplifiers) and data-in structures in block 1814, including voltage and/or current sources for the read, set, and reset modes are coupled to column/level decoder 1808 via data bus 1816. Data is supplied via a data-in line 1818 from input/output ports on integrated circuit 1800, or from other data sources internal or external to integrated circuit 1800, to data-in structures in block 1814.

Other circuitry 1820 may be included on integrated circuit 1800, such as a general purpose processor or special purpose application circuitry, or a combination of modules providing system-on-a-chip functionality supported by array 1802, in which case the array is used as embedded memory accessed by intra-chip connections. Data is supplied via a data-out line 1822 from the sense amplifiers in block 1814 to input/output ports on integrated circuit 1800, or to other data destinations internal or external to integrated circuit 1800 usable for inter-chip communications.

A controller 1824 implemented in this example, using a bias arrangement state machine, controls the application of bias circuitry voltage sources and current sources 1826 for the application of bias arrangements, including fast read, set, reset and verify voltages, and/or currents for the word lines and bit lines. The controller includes control circuitry configured for switching layers having a threshold voltage depending on the structure and composition of the memory cells, by applying a voltage to a selected memory cell so that the voltage on the switch in the select memory cell is above the threshold, and a voltage to an unselected memory cell so that the voltage on the switch in the unselected memory cell is below the threshold during a read operation or other operation accessing the selected memory cell.

Controller 1824 may be implemented using special-purpose logic circuitry as known in the art. In alternative embodiments, controller 1824 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1824.

In operation, each of the memory cells in the array 1802 stores data depending upon the resistance of the corresponding memory element. The data value may be determined, for example, by comparison of current on a bit line for a selected memory cell to that of a suitable reference current by sense amplifiers of sense circuitry (block 1814). The reference current can be established so that a predetermined range of currents correspond to a logical "0", and a differing range of current corresponds to a logical "1". In some embodiments, multiple bits per cell can be stored.

In some embodiments, the memory array 1802 is pre-coded with data, such as a computer program, prior to mounting the integrated circuit in a data processing system. This can be implemented using factory programming during the manufacturing process before or after packaging, and before delivery to customers.

Reading or writing to a memory cell of array 1802, therefore, can be achieved by applying a suitable voltage to bit lines using a voltage source so that current flows through the selected memory cell.

Figure 18:
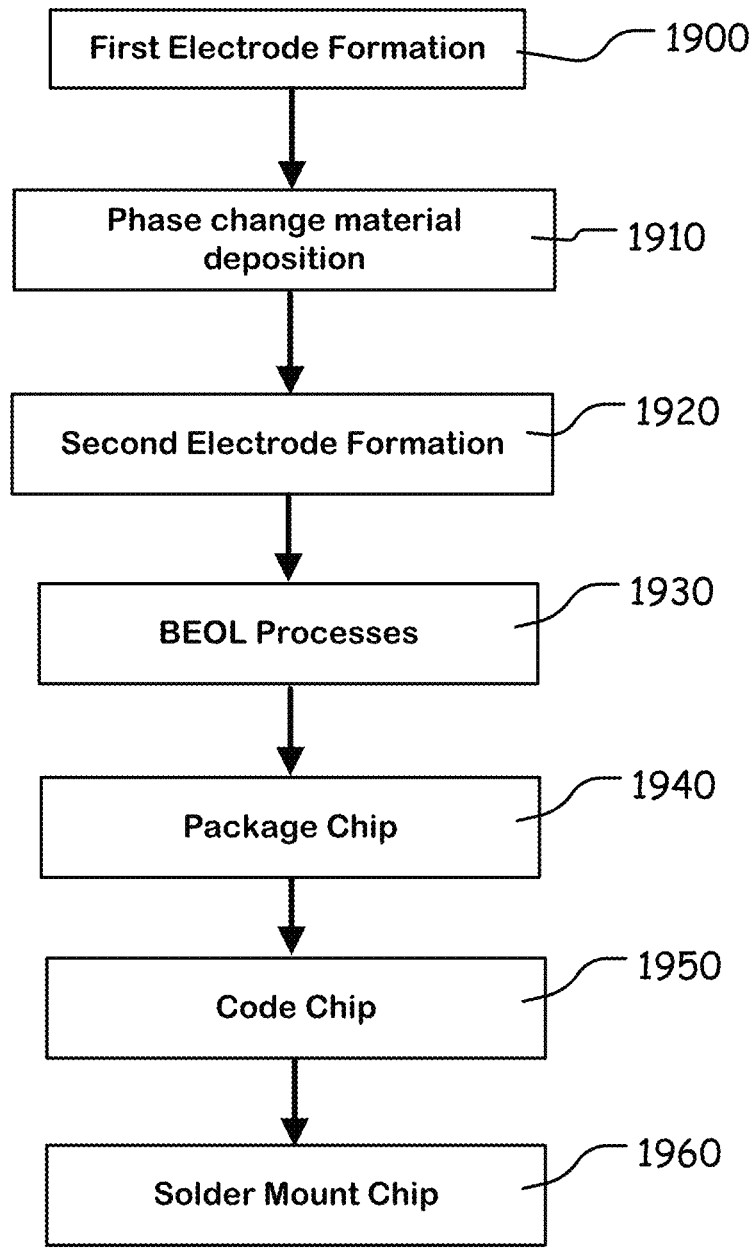
FIG. 18 is a simplified flowchart of a manufacturing process described herein.

FIG. 18 illustrates a process flow diagram of a manufacturing process for manufacturing an integrated circuit with a pre-coded array of memory cells, the memory cells having memory elements comprising $SiO_x$ doped, Ge-rich $Ge_xSb_yTe_z$ materials as described herein.

At step 1900, the first electrode 120 having a contact area 122 is formed, extending through dielectric 130. In the illustrated embodiment, the first electrode 120 comprises TiN and the dielectric 130 comprises SiN. In some embodiments, the contact area 122 of the first electrode 120 has a sub-lithographic width or diameter.

The first electrode 120 and the dielectric 130 can be formed by a number of processes. For example, a layer of electrode material can be formed on the top surface of access circuitry (not shown), followed by patterning of a layer of photoresist on the electrode layer using standard photolithographic techniques so as to form a mask of photoresist overlying the location of the first electrode 120. Next, the mask of photoresist is trimmed using, for example, oxygen plasma to form a mask structure having sub-lithographic dimensions overlying the location of the first electrode 120. Then, the layer of electrode material is etched using the trimmed mask of photoresist, thereby forming the first electrode 120 having a sub-lithographic diameter. Next dielectric 130 is formed and planarized.

At step 1910, a body of phase change material in the class of $SiO_x$ doped, Ge-rich $Ge_xSb_yTe_z$ materials described herein is deposited on the first electrode 120 and dielectric 130. The deposition of Ge-rich $Ge_xSb_yTe_z$ and silicon oxide may be carried out by co-sputtering of a Ge—Sb—Te target, and an $SiO_2$ target in an argon atmosphere. Alternatively, the deposition of Ge-rich $Ge_xSb_yTe_z$ and silicon oxide can be carried out using sputtering with a single composite $Ge_xSb_yTe_z$ and Si target with an oxygen reactive process. Other processes may be used as suits a particular phase change material and memory cell structure.

An optional annealing (not shown) can be performed to crystallize the phase change material. In the illustrated embodiment the thermal annealing step is carried out at 300° C. for 100 seconds in a nitrogen ambient. Alternatively, since subsequent back-end-of-line processes performed to complete the device may include high temperature cycles and/or a thermal annealing step depending upon the manufacturing techniques used to complete the device, in some embodiments the annealing may be accomplished by following processes, and no separate annealing step is added to the manufacturing line.

Next, at step 1920 a second electrode 140 is formed, resulting in the structure illustrated in FIG. 1. In the illustrated embodiment, the second electrode 140 comprises TiN.

Next, at step 1930 back-end-of-line (BEOL) processing is performed to complete the semiconductor process steps of the chip. The BEOL processes can be standard processes as known in the art, and the processes performed depend upon the configuration of the chip in which the memory cell is implemented. Generally, the structures formed by BEOL processes may include contacts, inter-layer dielectrics and various metal layers for interconnections on the chip including circuitry to couple the memory cell to peripheral circuitry. These BEOL processes may include deposition of dielectric material at elevated temperatures, such as depositing SiN at 400° C. or high density plasma HDP oxide deposition at temperatures of 500° C. or greater. As a result of these processes, control circuits and biasing circuits as shown in FIG. 17 are formed on the device including circuitry for set and reset operations.

This process can be extended to 3D memory arrays, by forming multiple layers of memory array circuits.

After BEOL processing, the chip be packaged in a single-chip or multichip package according to a particular need (1940). Also, the chip can be pre-coded with data such as without limitation, a computer program or control parameters (1950). The pre-coding can be performed before or after the packaging step 1940.

The pre-coded chip can then be solder mounted on a patterned circuit substrate, such as a printed circuit board, without significant loss of the pre-coded data (1960). In this context significant loss of pre-coded data would involve loss of amounts of data that are not recoverable using error correction available on the integrated circuit, or would involve loss of amounts of data that interfere with functionality of the integrated circuit in its mission function.

Figure 19:
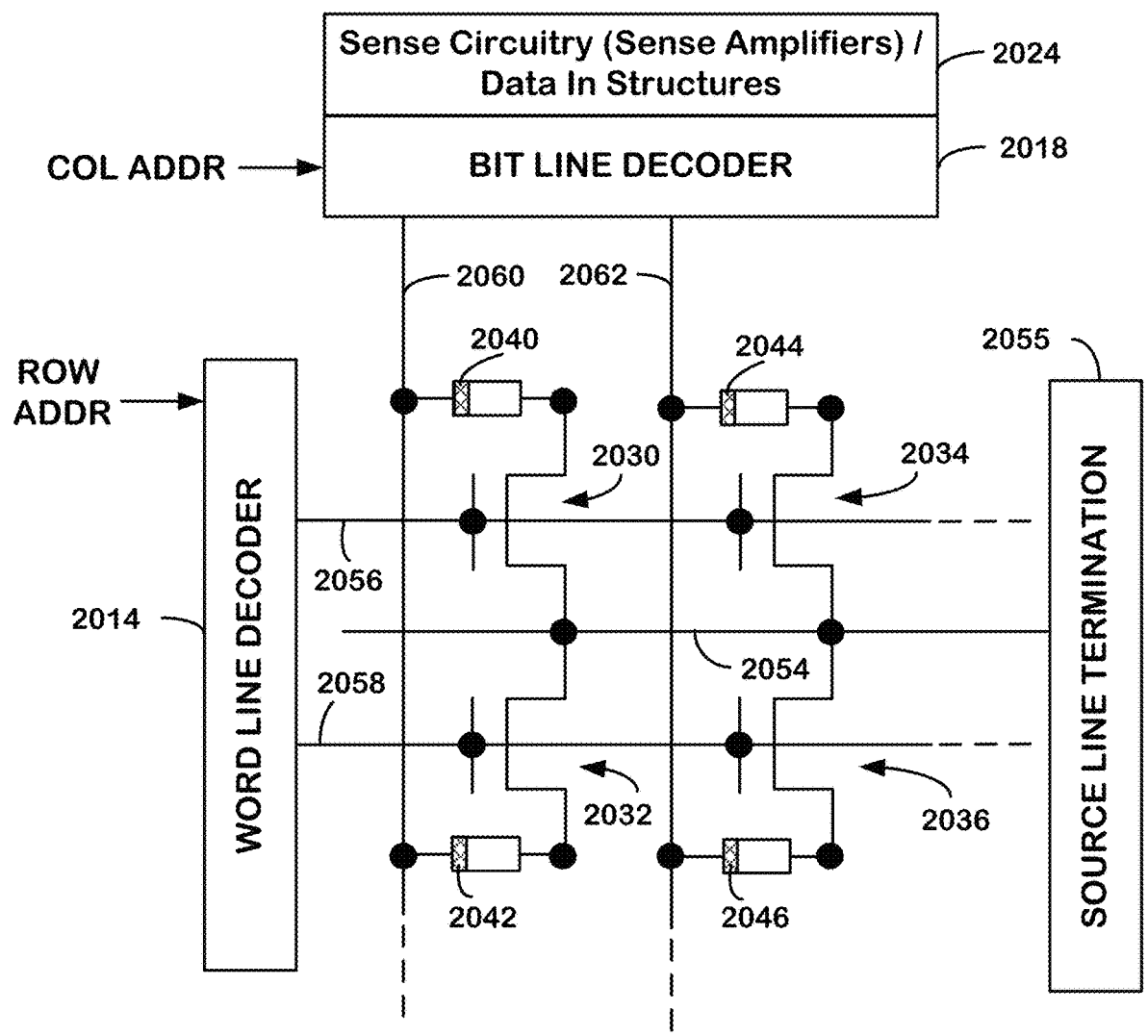
FIG. 19 is a schematic diagram of an array of one transistor/one memory element memory cells including buffer layers as described herein.

In FIG. 19, four one-transistor, one memory element (1T/1R) memory cells 2030, 2032, 2034, 2036 having memory elements 2040, 2042, 2044, 2046 which are body of $SiO_x$ doped, Ge-rich $Ge_xSb_yTe_z$ material phase change material, representing a small section of an array. Arrays of this type can be used on a memory device, and as embedded memory as discussed above.

Sources of each of the access transistors of memory cells 2030, 2032, 2034, 2036 are connected in common to a first-type access line 2054 (i.e. source line) that terminates in a source line termination of circuit 2055, such as a ground terminal. In another embodiment, the source lines of the access devices are not shared between adjacent cells, but are independently controllable. The source line termination circuit 2055 may include bias circuitry such as voltage sources and current sources, and decoding circuits for applying bias arrangements, other than ground, to the access line 2054, in some embodiments.

A plurality of second-type access lines, including word lines 2056, 2058, extend in parallel along a first direction. Word lines 2056, 2058 are in electrical communication with word line decoder 2014. The gates of access transistors of memory cells 2030 and 2034 are connected to word line 2056, and the gates of access transistors of memory cells 2032 and 2036 are connected in common to word line 2058.

A plurality of third-type access lines including bit lines 2060, 2062 extend in parallel in a second direction and are in electrical communication with bit line decoder 2018, and sense amplifiers and data-in circuits 2024. In the illustrated embodiment, each of the memory elements are arranged between the drain of the corresponding access device and the corresponding bit line. Alternatively, the memory elements may be on the source side of the corresponding access device. Control circuitry and biasing circuits (see FIG. 8) are coupled to the array, and provide means for applying set and reset operations to the memory cells.

Alternatively, the memory cells can be organized in a cross-point architecture. The first electrode can be the access lines, such as word lines and/or bit lines. In such architecture, the access devices, such as diodes or OTS switches are arranged between the memory elements and the access lines.

A method for manufacturing a circuit including an integrated circuit phase change memory having a memory element of $SiO_x$ doped, Ge-rich $Ge_xSb_yTe_z$ material, comprising:

pre-coding a data set in the integrated circuit phase change memory by inducing a lower resistance state in some cells in the memory, and a higher resistance state in some other cells in the memory; and after the coding, mounting the integrated circuit phase change memory on a substrate using a procedure that includes thermal cycling such as solder bonding that induces temperatures between 200° C. and 260° C.

A new class of phase change memory materials as described are characterized by high data retention, and a capability to pass the solder bonding thermal budget. This new class of phase change material is usable for embedded memory, as well as memory arrays in high density large-scale memory integrated circuits.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the disclosure and the scope of the following claims.

What is claimed is:

1. A memory device, comprising:
a first electrode and a second electrode;
a memory element in electrical series between the first and second electrode, comprising a $Ge_xSb_yTe_z$ phase change material with a silicon oxide additive, including a combination of elements having Ge in a range of 28 to 36 at %, Sb in a range of 10 to 20 at %, Te in a range of 25 to 40 at %, Si in a range of 5 to 10 at %, and O in a range of 12 to 23 at %, and a buffer layer between the phase change material and at least one of the first and second electrodes.

2. The device of claim 1, wherein the combination of elements includes Ge, Sb, Te, Si and O in amounts effective to have a crystallization transition temperature in excess of 250° C.

3. The device of claim 1, wherein the combination of elements includes Ge, Sb, Te, Si and O in amounts effective to have a set speed less than 1000 ns.

4. The device of claim 1, wherein the Ge is in a range of 29 to 32 at %.

5. The device of claim 1, wherein the Ge is in a range of 29 to 32 at %, the Sb is in a range of 15 to 16 at %, and the Te is in a range of 27 to 31 at %.

6. An integrated circuit comprising:
an array of memory cells having memory elements arranged in series between access lines, memory cells in the array comprising a $Ge_xSb_yTe_z$ phase change material with a silicon oxide additive, including a combination of elements having Ge in a range of 28 to 36 at %, Sb in a range of 10 to 20 at %, Te in a range of 25 to 40 at %, Si in a range of 5 to 10 at %, and O in a range of 12 to 23 at %, and a buffer layer between the phase change material and at least one of the access lines.

7. The integrated circuit of claim 6, wherein the combination of elements includes Ge, Sb, Te, Si and O in amounts effective to have a crystallization transition temperature in excess of 250° C.

8. The integrated circuit of claim 6, wherein the combination of elements includes Ge, Sb, Te, Si and O in amounts effective to have a set speed less than 1000 ns.

9. The integrated circuit of claim 6, wherein the combination of elements includes Ge, Sb, Te, Si and O in amounts effective to retain data stored in the memory elements of the array after exposure to 260° C. for 30 seconds.

10. The integrated circuit of claim 6, wherein the array is an embedded memory, and including logic on the integrated circuit configured to utilize the array to store data.

11. The integrated circuit of claim 6, wherein Ge is in a range of 29 to 32 at %.

12. The integrated circuit of claim 6, wherein the Ge is in a range of 29 to 32 at %, the Sb is in a range of 15 to 16 at %, and the Te is in a range of 27 to 31 at %.

13. The integrated circuit of claim 6, wherein the array is pre-coded with data before mounting the integrated circuit on a patterned circuit substrate.

14. A data processing device, comprising:
an integrated circuit solder bonded to a patterned circuit substrate, wherein the integrated circuit comprises an array of memory cells arranged in series between access lines, memory cells in the array having memory elements comprising a $Ge_xSb_yTe_z$ phase change material with a silicon oxide additive, including a combination of elements having Ge in a range of 28 to 36 at %, Sb in a range of 10 to 20 at %, Te in a range of 25 to 40 at %, Si in a range of 5 to 10 at %, and O in a range of 12 to 23 at %, and a buffer layer between the phase change material and at least one of the access lines.

15. The data processing device of claim 14, wherein the combination of elements includes Ge, Sb, Te, Si and O in amounts effective to have a set speed less than 1000 ns.

16. The data processing device of claim 14, further including at least one additional integrated circuit solder bonded to the patterned circuit substrate.

17. The data processing device of claim 14, wherein the array is an embedded memory, and including logic on the integrated circuit configured to utilize the array to store data.

18. The data processing device of claim 14, wherein the Ge is in a range of 29 to 32 at %.

19. The data processing device of claim 14, wherein the Ge is in a range of 29 to 32 at %, the Sb is in a range of 15 to 16 at %, and the Te is in a range of 27 to 31 at %.

20. The data processing device of claim 14, wherein the array is pre-coded with data before solder bonding to the patterned circuit substrate.

21. A method for manufacturing a data processing device, comprising:
storing data in an array of memory cells on an integrated circuit, the array of memory cells having memory elements arranged in series between access lines, memory cells in the array comprising a $Ge_xSb_yTe_z$ phase change material with a silicon oxide additive, including a combination of elements having Ge in a range of 28 to 36 at %, Sb in a range of 10 to 20 at %, Te in a range of 25 to 40 at %, Si in a range of 5 to 10 at %, and O in a range of 12 to 23 at % and a buffer layer between the phase change material and at least one of the access lines; and
after storing the data, solder bonding the integrated circuit to a patterned circuit substrate.

* * * * *